United States Patent
de Guzman et al.

(10) Patent No.: US 7,576,401 B1
(45) Date of Patent: Aug. 18, 2009

(54) DIRECT GLASS ATTACHED ON DIE OPTICAL MODULE

(75) Inventors: Arsenio de Guzman, Chandler, AZ (US); Robert F. Darveaux, Higley, AZ (US); Young Ho Kim, Seoul (KR)

(73) Assignee: Amkor Technology, Inc., Chandler, AZ (US)

( * ) Notice: Subject to any disclaimer, the term of this patent is extended or adjusted under 35 U.S.C. 154(b) by 681 days.

(21) Appl. No.: 11/177,904

(22) Filed: Jul. 7, 2005

(51) Int. Cl.
H01L 31/02 (2006.01)
H01L 27/146 (2006.01)
H01L 31/101 (2006.01)
H01L 31/0203 (2006.01)
H01L 31/113 (2006.01)
G02B 7/00 (2006.01)
G02B 7/02 (2006.01)

(52) U.S. Cl. .................. 257/432; 257/E31.117; 257/E31.127; 257/E33.076; 257/294; 257/433; 257/435; 257/234; 257/680; 257/774; 257/728

(58) Field of Classification Search .............. 257/432, 257/294, 433, 435, 234, 680, 774, 728, E31.117, 257/E31.127, E33.076
See application file for complete search history.

(56) References Cited

U.S. PATENT DOCUMENTS

| | | | |
|---|---|---|---|
| 3,880,528 A | 4/1975 | Petersen et al. | 356/225 |
| 4,055,761 A | 10/1977 | Shimomura | 250/239 |
| 4,491,865 A | 1/1985 | Danna et al. | 358/98 |
| 4,896,217 A | 1/1990 | Miyazawa et al. | 358/213.11 |
| 4,999,142 A | 3/1991 | Fukushima et al. | 264/1.7 |
| 5,023,442 A | 6/1991 | Taniguchi et al. | 250/208.1 |
| 5,068,713 A | 11/1991 | Toda | 357/72 |
| 5,122,861 A | 6/1992 | Tamura et al. | 357/74 |
| 5,220,198 A | 6/1993 | Tsuji | 257/731 |
| 5,274,456 A | 12/1993 | Izumi et al. | 358/209 |
| 5,365,101 A | 11/1994 | Tonai | 257/434 |
| 5,383,034 A | 1/1995 | Imamura et al. | 358/474 |
| 5,400,072 A | 3/1995 | Izumi et al. | 348/335 |
| 5,412,229 A | 5/1995 | Kuhara et al. | 257/183 |
| 5,424,531 A | 6/1995 | O'Regan et al. | 250/216 |

(Continued)

FOREIGN PATENT DOCUMENTS

GB 1022329 7/1964

(Continued)

OTHER PUBLICATIONS

Lee et al., U.S. Appl. No. 11/115,574, filed Apr. 26, 2005, entitled "Image Sensor Package and its Manufacturing Method".

(Continued)

*Primary Examiner*—Alexander O Williams
(74) *Attorney, Agent, or Firm*—Gunnison, McKay & Hodgson, L.L.P.; Serge J. Hodgson

(57) ABSTRACT

An optical module includes an image sensor having an active area and a window mounted directly to the image sensor above the active area. The optical module further includes a mount mounted to the window, the mount supporting a barrel having a lens assembly. By mounting the window directly to the image sensor and the mount directly to the window, the substrate surface area of the optical module is minimized.

20 Claims, 12 Drawing Sheets

U.S. PATENT DOCUMENTS

| | | | |
|---|---|---|---|
| 5,434,682 A | 7/1995 | Imamura et al. | 358/474 |
| 5,436,492 A | 7/1995 | Yamanaka | 257/433 |
| 5,444,520 A | 8/1995 | Murano | 355/229 |
| 5,463,229 A | 10/1995 | Takase et al. | 257/59 |
| 5,489,995 A | 2/1996 | Iso et al. | 358/483 |
| 5,523,608 A | 6/1996 | Kitaoka et al. | 257/433 |
| 5,570,204 A | 10/1996 | Kumashiro | 358/471 |
| 5,581,094 A | 12/1996 | Hara et al. | 257/80 |
| 5,604,362 A | 2/1997 | Jedlicka et al. | 257/233 |
| 5,617,131 A | 4/1997 | Murano et al. | 347/233 |
| 5,655,189 A | 8/1997 | Murano | 399/220 |
| 5,672,902 A | 9/1997 | Hatanaka et al. | 257/431 |
| 5,783,815 A | 7/1998 | Ikeda | 250/208.1 |
| 5,804,827 A | 9/1998 | Akagawa et al. | 250/370.06 |
| 5,811,799 A | 9/1998 | Wu | 250/239 |
| 5,821,532 A | 10/1998 | Beaman et al. | 250/239 |
| 5,825,560 A | 10/1998 | Ogura et al. | 359/822 |
| 5,861,654 A | 1/1999 | Johnson | 257/433 |
| 5,902,993 A | 5/1999 | Okushiba et al. | 250/208.1 |
| 5,932,875 A | 8/1999 | Chung et al. | 250/239 |
| 5,998,878 A | 12/1999 | Johnson | 257/797 |
| 6,011,294 A | 1/2000 | Wetzel | 257/434 |
| 6,011,661 A | 1/2000 | Weng | 359/819 |
| 6,020,582 A | 2/2000 | Bawolek et al. | 250/208.1 |
| 6,037,655 A | 3/2000 | Philbrick et al. | 257/680 |
| 6,060,722 A | 5/2000 | Havens et al. | 250/566 |
| 6,072,232 A | 6/2000 | Li et al. | 257/680 |
| 6,122,009 A | 9/2000 | Ueda | 348/335 |
| 6,130,448 A | 10/2000 | Bauer et al. | 257/222 |
| 6,147,389 A | 11/2000 | Stern et al. | 257/434 |
| 6,153,927 A | 11/2000 | Raj et al. | 257/680 |
| 6,184,514 B1 | 2/2001 | Rezende et al. | 250/208.1 |
| 6,384,397 B1 | 5/2002 | Takiar et al. | 250/208.1 |
| 6,384,472 B1 | 5/2002 | Huang | 257/680 |
| 6,392,703 B1 | 5/2002 | Uchino et al. | 348/373 |
| 6,476,417 B2 | 11/2002 | Honda et al. | 257/59 |
| 6,483,101 B1 | 11/2002 | Webster | 250/216 |
| 6,498,624 B1 | 12/2002 | Ogura et al. | 348/335 |
| 6,509,560 B1 | 1/2003 | Glenn et al. | 250/239 |
| 6,518,656 B1 | 2/2003 | Nakayama et al. | 257/680 |
| 6,627,864 B1 | 9/2003 | Glenn et al. | 250/208.1 |
| 6,627,872 B1 | 9/2003 | FuKamura et al. | 250/239 |
| 6,686,588 B1 * | 2/2004 | Webster et al. | 250/239 |
| 6,762,796 B1 | 7/2004 | Nakajoh et al. | 348/340 |
| 6,767,753 B2 | 7/2004 | Huang | 438/25 |
| 6,777,767 B2 | 8/2004 | Badehi | 257/432 |
| 6,798,031 B2 | 9/2004 | Honda et al. | 257/433 |
| 6,813,099 B2 | 11/2004 | Yamaguchi | 359/779 |
| 6,867,438 B1 | 3/2005 | Maruyama et al. | 257/184 |
| 6,870,208 B1 * | 3/2005 | You et al. | 257/291 |
| 6,870,238 B2 | 3/2005 | Exposito et al. | 257/431 |
| 6,939,456 B2 | 9/2005 | Shiau | 250/208.1 |
| 7,031,083 B2 | 4/2006 | Chen | 359/819 |
| 7,144,745 B2 | 12/2006 | Badehi | 438/7 |
| 2002/0154239 A1 * | 10/2002 | Fujimoto et al. | 348/340 |
| 2003/0137595 A1 | 7/2003 | Takachi | 348/340 |
| 2003/0222333 A1 | 12/2003 | Bolken et al. | 257/678 |
| 2004/0065952 A1 | 4/2004 | Prior | 257/724 |
| 2004/0113286 A1 | 6/2004 | Hsieh et al. | 257/787 |
| 2004/0217454 A1 | 11/2004 | Brechignac et al. | 257/678 |
| 2004/0251509 A1 | 12/2004 | Choi | 257/432 |
| 2005/0035421 A1 * | 2/2005 | Kayanuma et al. | 257/432 |
| 2005/0073036 A1 | 4/2005 | Appelt et al. | 257/678 |
| 2005/0104991 A1 | 5/2005 | Hoshino et al. | 348/340 |
| 2005/0161780 A1 | 7/2005 | Wang et al. | 257/678 |
| 2005/0253951 A1 * | 11/2005 | Fujimoto et al. | 348/335 |
| 2005/0258350 A1 | 11/2005 | Van Arendonk et al. | 250/239 |
| 2005/0258518 A1 | 11/2005 | Yang et al. | 257/666 |
| 2006/0016973 A1 | 1/2006 | Yang et al. | 250/239 |
| 2006/0192230 A1 | 8/2006 | Wood et al. | 257/234 |
| 2007/0146894 A1 * | 6/2007 | Humpston | 359/666 |

FOREIGN PATENT DOCUMENTS

| | | |
|---|---|---|
| GB | 2 146 504 | 4/1985 |
| JP | 59-228755 | 12/1984 |
| JP | 62-224047 | 10/1987 |
| JP | 09-021938 | 1/1997 |
| JP | 09-232548 | 9/1997 |
| JP | 10-302587 | 11/1998 |
| WO | WO 93/22787 | 11/1993 |
| WO | WO 00/38103 | 6/2000 |
| WO | WO 03/019660 | 3/2003 |

OTHER PUBLICATIONS

Heo et al., U.S. Appl. No. 11/116,631, filed Apr. 27, 2005, entitled "Image Sensor Package Having Mount Holder Attached to Image Sensor Die".

* cited by examiner

DIRECT GLASS ATTACHED ON DIE OPTICAL MODULE

BACKGROUND OF THE INVENTION

1. Field of the Invention

The present invention relates generally to the packaging of electronic components. More particularly, the present invention relates to an optical module and method for fabricating the same.

2. Description of the Related Art

Image sensors are well known to those of skill in the art. An image sensor included an active area, which was responsive to light. The image sensor was used to fabricate an optical module, sometimes called a camera module.

The optical module was incorporated into a device such as a digital camera or camera phone. To allow miniaturization of these devices, the optical module should have a minimum size.

SUMMARY OF THE INVENTION

In accordance with one embodiment, an optical module includes an image sensor having an active area and a window mounted directly to the image sensor above the active area. The optical module further includes a mount mounted to the window, the mount supporting a barrel having a lens assembly. By mounting the window directly to the image sensor and the mount directly to the window, the substrate surface area of the optical module is minimized.

These and other features of the present invention will be more readily apparent from the detailed description set forth below taken in conjunction with the accompanying drawings.

BRIEF DESCRIPTION OF THE DRAWINGS

In the following description, the same or similar elements are labeled with the same or similar reference numbers.

DETAILED DESCRIPTION

Figure 1:
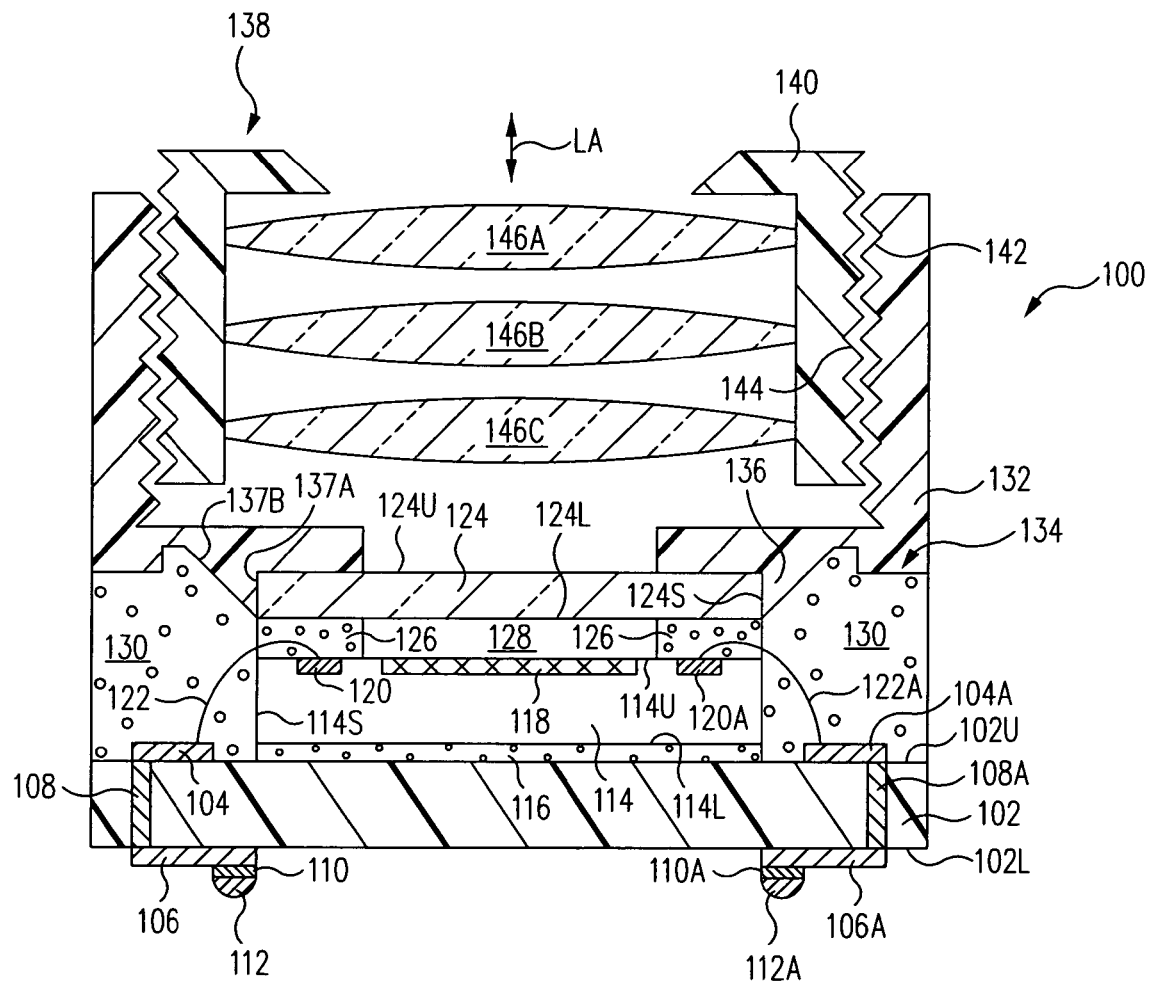
FIG. 1 is a cross-sectional view of an optical module in accordance with one embodiment of the present invention.

In accordance with one embodiment, referring to FIG. 1, an optical module 100 includes an image sensor 114 having an active area 118 and a window 124 mounted directly to image sensor 114 above active area 118. Optical module 100 further includes a mount 132 mounted to window 124, mount 132 supporting a barrel 140 having a lens assembly 146A, 146B, 146C. By mounting window 124 directly to image sensor 114 and mount 132 directly to window 124, the surface area of substrate 102 is minimized thus minimizing the size of optical module 100.

More particularly, FIG. 1 is a cross-sectional view of an optical module 100, sometimes called a camera module, in accordance with one embodiment of the present invention. Optical module 100 is used in a wide variety of applications, e.g., digital cameras and cellular camera phones.

Optical module 100 includes a substrate 102, e.g., formed of ceramic, pre-molded plastic or laminate, although substrate 102 is formed of other materials in other embodiments. Substrate 102 includes an upper, e.g., first, surface 102U and a lower, e.g., second, surface 102L, opposite upper surface 102U.

Formed on upper surface 102U of substrate 102 are a plurality of electrically conductive upper traces 104, which include a first upper trace 104A. Formed on lower surface 102L of substrate 102 are a plurality of electrically conductive lower traces 106, which include a first lower trace 106A. Extending through substrate 102 from lower surface 102L to upper surface 102U are a plurality of electrically conductive vias 108, which include a first via 108A. Lower traces 106 are electrically connected to upper traces 104 by vias 108. To illustrate, lower trace 106A is electrically connected to upper trace 104A by via 108A.

Formed on lower traces 106 are electrically conductive pads 110, which include a first pad 110A. Formed on pads 110 are electrically conductive interconnection balls 112, e.g., solder. To illustrate, pad 110A is formed on lower trace 106A. A first interconnection ball 112A of the plurality of interconnection balls 112 is formed on pad 110A. Interconnection balls 112 are used to connect optical module 100 to a larger substrate such as a printed circuit mother board.

Although a particular electrically conductive pathway between upper traces 104 and interconnection balls 112 is described above, other electrically conductive pathways can be formed. For example, contact metallizations can be formed between the various electrical conductors. Alternatively, pads 110 are not formed and interconnection balls 112 are formed directly on lower traces 106.

Further, instead of straight though vias 108, in one embodiment, substrate 102 is a multi-layer laminate substrate and a plurality of vias and/or internal traces form the electrical interconnection between traces 104 and 106.

In yet another embodiment, interconnection balls 112 are distributed in an array format to form a ball grid array (BGA) type optical module. Alternatively, interconnection balls 112 are not formed, e.g., to form a metal land grid array (LGA) type optical module. In yet another alternative, pads 110/ interconnection balls 112 are not formed, e.g., to form a leadless chip carrier (LCC) type optical module. In another embodiment, optical module 100 is inserted into a socket that is pre-mounted on the larger substrate, e.g., on the printed circuit mother board. BGA, LGA and LCC type modules are well known to those of skill in the art.

In another embodiment, a flex connector, sometimes called an edge connector or flex strip, is electrically connected to lower traces 106, e.g., for applications where optical module 100 is remote from the larger substrate. Other electrically conductive pathway modifications will be obvious to those of skill in the art.

Mounted, sometimes called die attached, to upper surface 102U of substrate 102 is an image sensor 114. More particularly, a lower, e.g., first, surface 114L of image sensor 114 is mounted to upper surface 102U, for example, with an adhesive 116, sometimes called an image sensor adhesive or die attach adhesive.

Image sensor 114 further includes an upper, e.g., second, surface 114U. An active area 118 and bond pads 120 of image sensor 114 are formed on upper surface 114U. In this embodiment, upper surface 102U, lower surface 114L, and upper surface 114U are parallel to one another. Although various structures may be described as being parallel or perpendicular, it is understood that the structures may not be exactly parallel or perpendicular but only substantially parallel or perpendicular to within accepted manufacturing tolerances.

Generally, active area 118 of image sensor 114 is responsive to light, e.g., electromagnetic radiation, as is well known to those of skill in the art. For example, active area 118 is responsive to infrared radiation, ultraviolet light, and/or visible light. Illustratively, image sensor 114 is a CMOS image sensor device, a charge coupled device (CCD), a pyroelectric ceramic on CMOS device, or an erasable programmable read-only memory device (EPROM) although other image sensors are used in other embodiments.

Upper traces 104 are electrically connected to bond pads 120 by bond wires 122. To illustrate, a first bond pad 120A of the plurality of bond pads 120 is electrically connected to upper trace 104A by a first bond wire 122A of the plurality of bond wires 122.

A window 124 is mounted to image sensor 114. More particularly, a lower, e.g., first, surface 124L of window 124 is mounted to upper surface 114U of image sensor 114 with a window adhesive 126. In one embodiment, window 124 includes a filter, e.g., an infrared filter. Accordingly, window 124 is sometimes called an IR glass.

In accordance with this embodiment, lower surface 124L of window 124 corresponds to upper surface 114U of window 114. Stated another way, lower surface 124L of window 124 has the same shape, e.g., a rectangular shape having the same length and width, as upper surface 114U of image sensor 114 such that the total surface areas of lower surface 124L and upper surface 114U are equal. However, in other embodiments, the total area of lower surface 124L of window 124 is greater than or less than the total area of upper surface 114U of image sensor 114.

In accordance with this embodiment, window adhesive 126 mounts the periphery of upper surface 114U of image sensor 114 to the periphery of lower surface 124L of window 124. Window adhesive 126 is applied directly on and covers bond pads 120 and at least a portion of bond wires 122. Window adhesive 126 is a nonconductive material, sometimes called a dielectric or electrically insulating material. Window adhesive 126 spaces window 124 above the loop height of bond wires 122, i.e., apart from bond wires 122.

Window adhesive 126 does not cover active area 118 in accordance with this embodiment. Accordingly, a cavity 128 is formed by upper surface 114U of image sensor 114, lower surface 124L of window 124, and window adhesive 126. Active area 118 is located within cavity 128.

Bond wires 122 are enclosed in an encapsulant 130. More particularly, encapsulant 130 covers the exposed portion of upper surface 102U of substrate 102, sides 114S of image sensor 114, window adhesive 126 and bond wires 122. Encapsulant 130 protects bond wires 122. Further, in accordance with this embodiment, encapsulant 130, e.g., a cured liquid encapsulant, mounts a mount 132 above and to window 124.

In this embodiment, mount 132, sometimes called a lens holder, includes a mounting surface 134, which is attached to encapsulant 130 and the periphery of an upper, e.g., second, surface 124U of window 124. Window 124 further includes sides 124S extending between and perpendicular to upper surface 124U and lower surface 124L of window 124.

To increase the contact surface area and thus the bond strength with encapsulant 130, mounting surface 134 includes a protruding lip 136 which protrudes into encapsulant 130 around window 124. Protruding lip 136 includes first and second surfaces 137A, 137B. First surface 137A, sometimes called vertical surface 137A, is parallel to and abuts side 124S of window 124. Second surface 137B, sometimes called slanted surface 137B, is angled upwards and outwards from first surface 137A. As discussed in greater detail below with reference to FIG. 5, slanted surface 137B serves as a funnel for encapsulant 130 and causes encapsulant 130 to flow away from the direction of window 124 during mounting of mount 132.

By mounting window 124 directly to image sensor 114 and mount 132 directly to window 124, the area of upper surface 102U of substrate 102 is minimized. More generally, the size of substrate 102 is reduced compared to a substrate of an optical module in which the mount is mounted to the substrate laterally adjacent to and around the image sensor. Accordingly, optical module 100 has a small size, sometimes called a small footprint, allowing miniaturization of devices such as digital cameras or camera phones using optical module 100.

Mount 132 includes a central aperture 138 having a longitudinal axis LA perpendicular to upper surface 114U of image sensor 114. Central aperture 138 extends upwards and is aligned above active area 118.

Mount 132 supports a barrel 140. In one embodiment, barrel 140 is threadedly attached to mount 132 such that rotation of barrel 140 moves barrel 140 relative to mount 132. For example, mount 132 includes an inner cylindrical threaded surface 142 that defines central aperture 138. Barrel 140 includes an outer cylindrical threaded surface 144 that is threadedly attached to inner cylindrical threaded surface 142 of mount 132. However, in another embodiment, barrel 140 is fixedly attached to mount 132, e.g., with adhesive.

Barrel 140 includes at least a single lens such as a single lens or multiple lenses, e.g., one, two, three, four or more lenses made of plastic or glass, stacked together to form a lens system. In this embodiment, barrel 140 includes three lenses 146A, 146B, 146C, collectively referred to as lenses 146 or a lens assembly. Lenses 146 focus light on active area 118.

Figure 2:
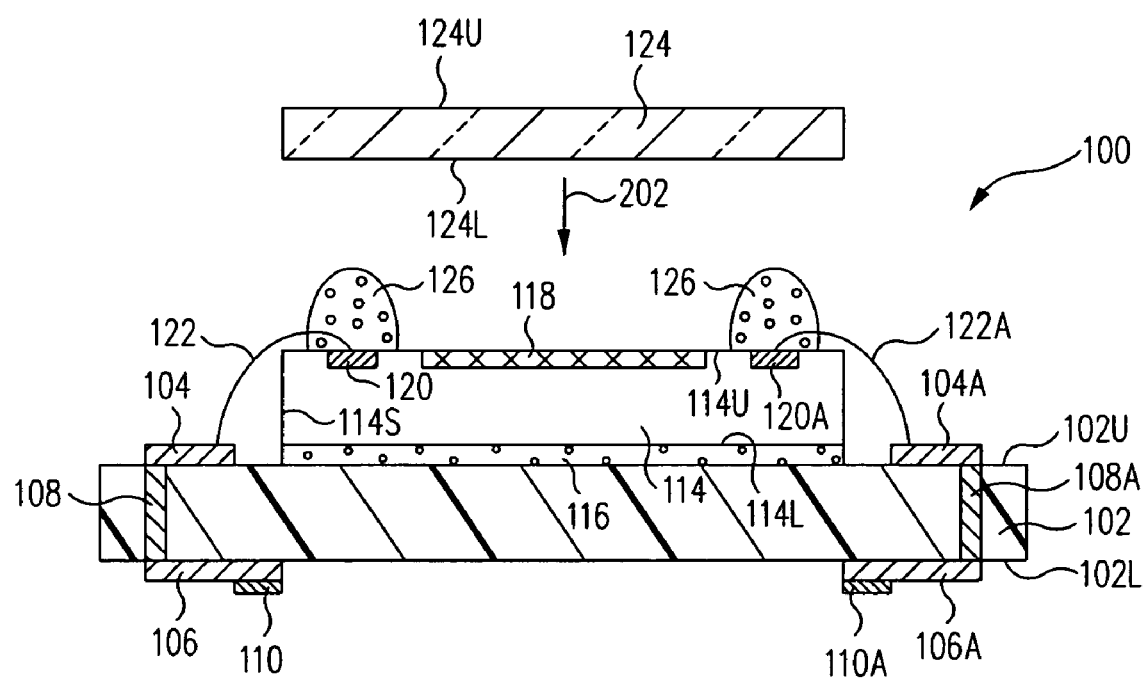
FIG. 2 is a cross-sectional view of the optical module of FIG. 1 during fabrication in accordance with one embodiment of the present invention.

FIG. 2 is a cross-sectional view of optical module 100 of FIG. 1 during fabrication in accordance with one embodiment of the present invention. Referring now to FIG. 2, lower surface 114L of image sensor 114 is attached to upper surface 102U of substrate 102 by adhesive 116. Bond pads 120 of image sensor 114 are electrically connected to upper traces 104 by bond wires 122. In one embodiment, bond wires 122 are formed by reversed stand off stitch bonding (RSSB).

Figure 3A:
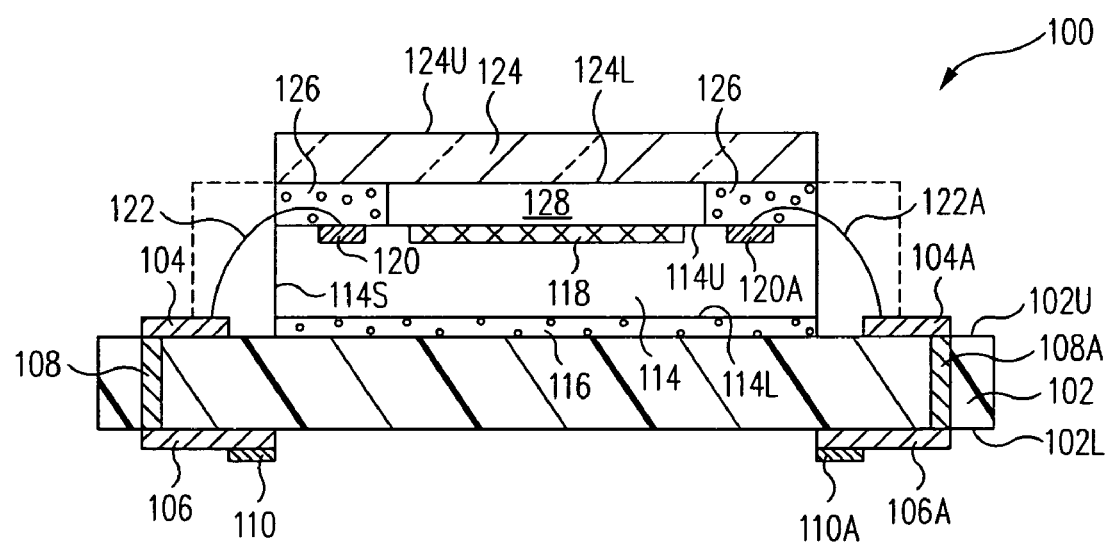
FIG. 3A is a cross-sectional view of the optical module of FIG. 2 at a further stage during fabrication in accordance with one embodiment of the present invention.

Window adhesive 126 is applied to the periphery of upper surface 114U of image sensor 114 and directly on and over bond pads 120. Window 124 is moved relative to image sensor 114 in the direction of arrow 202 and into window adhesive 126. Window adhesive 126 is cured, e.g., optically or thermally cured, thus mounting window 124 to image sensor 114 as shown in FIG. 3A. In one embodiment, a normal die bonder is used for attachment of window 124 to image sensor 114.

FIG. 3A is a cross-sectional view of optical module 100 of FIG. 2 at a further stage during fabrication in accordance with one embodiment of the present invention. Referring now to FIG. 3A, window adhesive 126 mounts the periphery of lower surface 124L of window 124 to the periphery of upper surface 114U of image sensor 114. In another embodiment, window adhesive 126 entirely covers bond wires 122 as indicated by the dashed lines. In accordance with this embodiment, window adhesive 126 also encloses sides 114S of image sensor 114 as well as the adjacent portion of upper surface 102U of substrate 102.

Figure 3B:
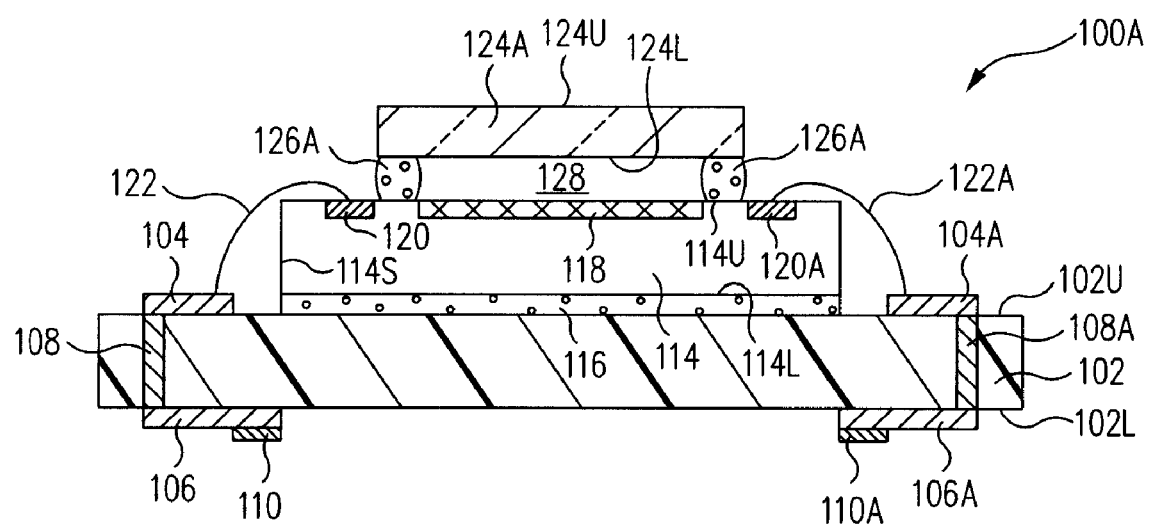
FIG. 3B is a cross-sectional view of an optical module similar to the optical module of FIG. 1 during fabrication in accordance with another embodiment of the present invention.

FIG. 3B is a cross-sectional view of an optical module 100A similar to optical module 100 of FIG. 1 during fabrication in accordance with another embodiment of the present invention. Referring now to FIG. 3B, a window 124A is mounted to upper surface 114U of image sensor 114 by a window adhesive 126A. More particularly, window adhesive 126A is applied to upper surface 114U between bond pads 120 and active area 118. Thus, window adhesive 126A does not cover bond pads 120, bond wires 122 or active area 118 in accordance with this embodiment.

Further, the total area of lower surface 124L of window 124A is less than the total area of upper surface 114U of image sensor 114 in accordance with this embodiment. More particularly, window 124A fits entirely inwards of bond pads 120 although window 124A extends over bond pads 120 in another embodiment.

In one embodiment, window 124A is attached to image sensor 114 while image sensor 114 is still in wafer form. Window 124A and window adhesive 126A protect active area 118 from particulates generated during singulation of image sensor 114 from the wafer in accordance with this embodiment. However, in another embodiment, window 124A is attached to image sensor 114 after singulation of image sensor 114 from the wafer.

Fabrication of optical module 100A of FIG. 3B is similar to fabrication of optical module 100 of FIG. 1 and so is not discussed further to avoid detracting from the principles of the invention.

Figure 4:
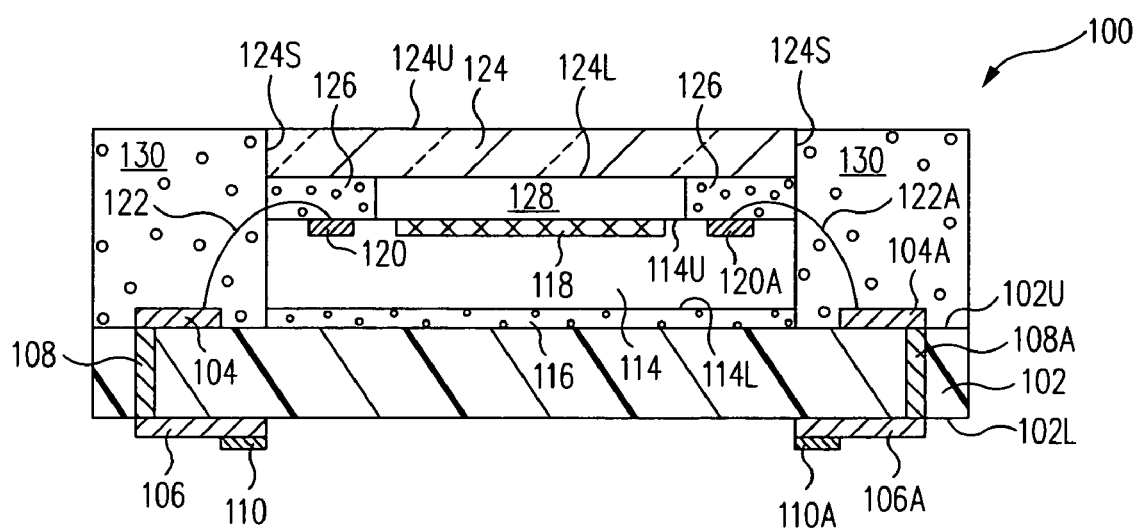
FIG. 4 is a cross-sectional view of the optical module of FIG. 3A at a further stage during fabrication in accordance with one embodiment of the present invention.

FIG. 4 is a cross-sectional view of optical module 100 of FIG. 3A at a further stage during fabrication in accordance with one embodiment of the present invention. Referring now to FIG. 4, encapsulant 130, e.g., a liquid encapsulant, is applied, e.g., dispensed, to the periphery of upper surface 102U of substrate 102. Encapsulant 130 is applied to enclose image sensor 114, window adhesive 126, sides 124S of window 124, and bond wires 122. In accordance with another embodiment, encapsulant 130, sometimes called mold or molding compound, is formed using a mold as those of skill in the art will understand and the particular molding technique used is not essential to this embodiment of the present invention.

In one embodiment, optical module 100 is fabricated simultaneously with a plurality of optical modules in an array. After application of encapsulant 130, optical module 100 is singulated from the array, e.g., using a saw or by punch singulation. Active area 118 is protected by window 124, window adhesive 126 and encapsulant 130 from particulates generated during the sawing and removal of the particulates.

Figure 5:
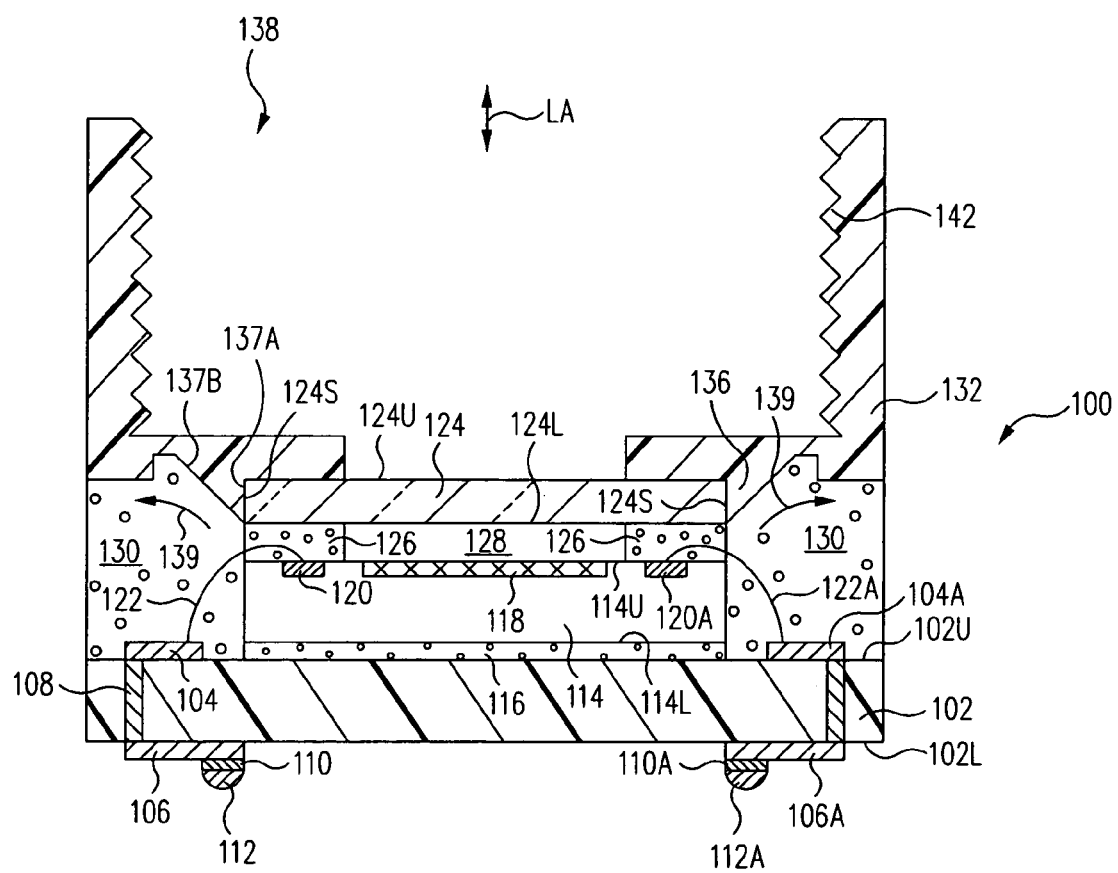
FIG. 5 is a cross-sectional view of the optical module of FIG. 4 at a further stage during fabrication in accordance with one embodiment of the present invention.

FIG. 5 is a cross-sectional view of optical module 100 of FIG. 4 at a further stage during fabrication in accordance with one embodiment of the present invention. Referring now to FIG. 5, interconnection balls 112 are formed. In other embodiments, interconnection balls 112 are formed at an earlier or later stage of fabrication of optical module 100.

Mount 132 is pressed into encapsulant 130 and on to upper surface 124U of window 124. As mount is pressed into encapsulant 130, slanted surface 137B of protruding lip 136 causes encapsulant 130 to flow away from window 124 as indicated by the arrows 139. Encapsulant 130 is cured, e.g., optically or thermally, thus mounting mount 132 to window 124. Barrel 140 (FIG. 1) is mounted to mount 132 thus completing fabrication of optical module 100.

Figure 6:
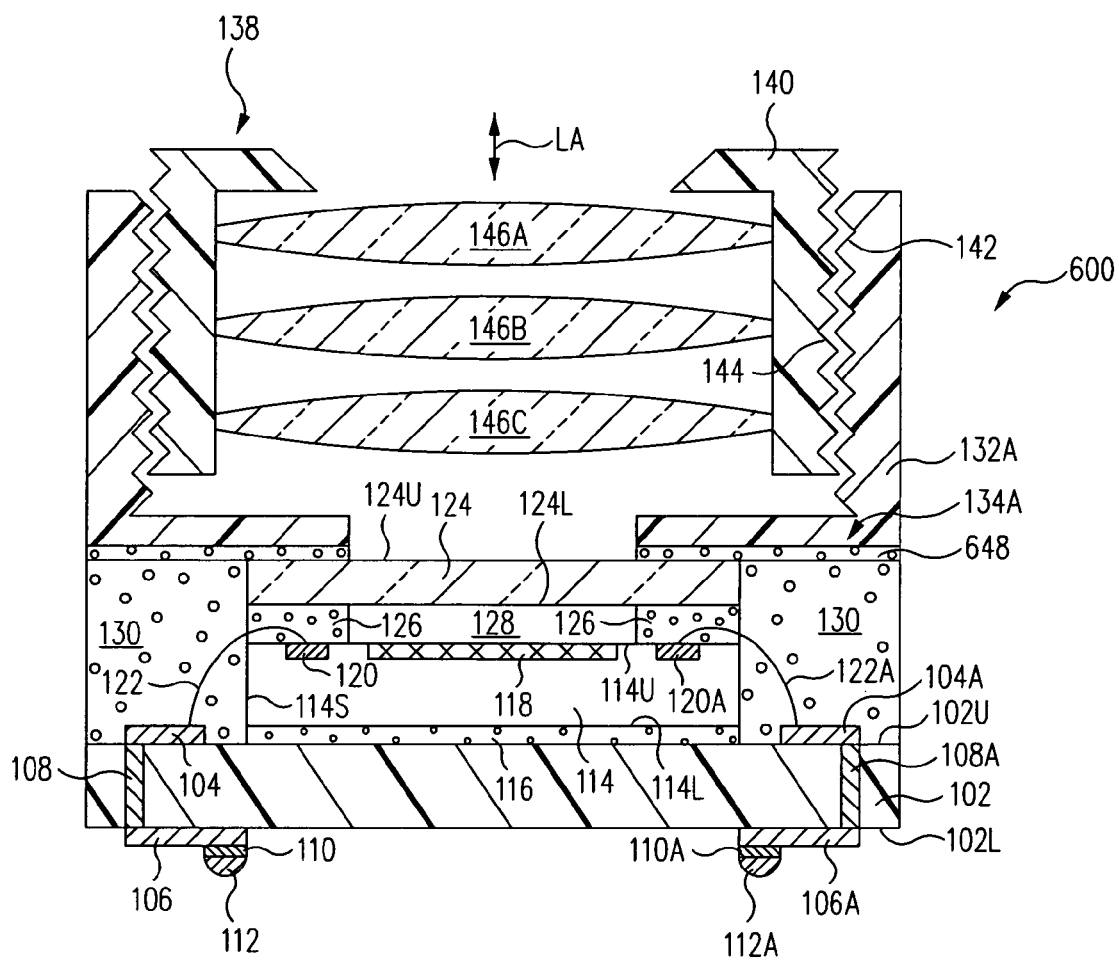
FIG. 6 is a cross-sectional view of an optical module in accordance with another embodiment of the present invention.

FIG. 6 is a cross-sectional view of an optical module 600 in accordance with another embodiment of the present invention. Optical module 600 of FIG. 6 is similar to optical module 100 of FIG. 1 and only the significant differences between optical module 600 and optical module 100 are discussed below.

Referring now to FIG. 6, a mount 132A includes a planar rectangle annular mounting surface 134A, i.e., does not include a protruding lip. Mount 132A is mounted to upper surface 124U of window 124 and encapsulant 130 by a mount adhesive 648. In one embodiment, mount adhesive 648 entirely covers mounting surface 134A of mount 132A.

Figure 7:
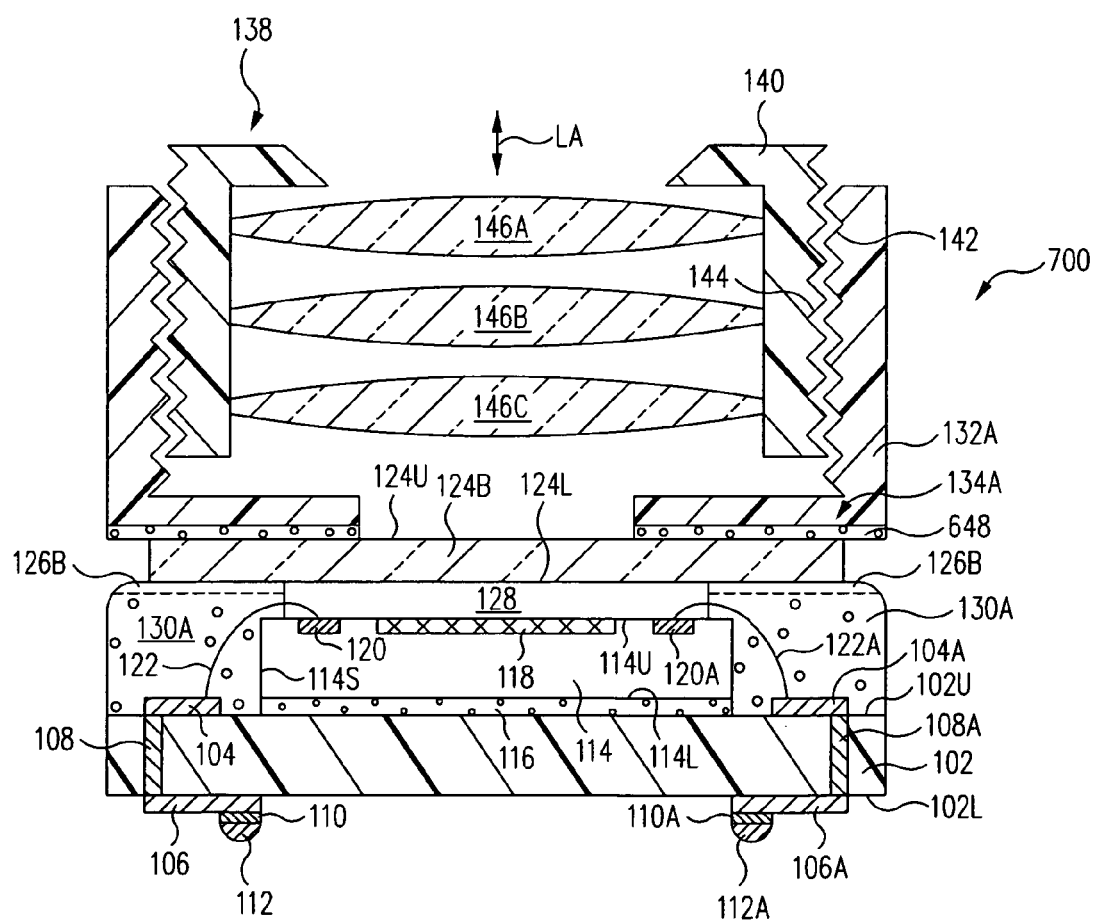
FIG. 7 is a cross-sectional view of an optical module in accordance with another embodiment of the present invention.

FIG. 7 is a cross-sectional view of an optical module 700 in accordance with another embodiment of the present invention. Optical module 700 of FIG. 7 is similar to optical module 600 of FIG. 6 and only the significant differences between optical module 700 and optical module 600 are discussed below.

Referring now to FIG. 7, a window 124B is mounted by encapsulant 130A above and to image sensor 114. In one embodiment, encapsulant 130A is a cured liquid encapsulant. In accordance with this embodiment, encapsulant 130A directly adheres to lower surface 124L of window 124B. In another embodiment, encapsulant 130A is mold. In accordance with this embodiment, window 124B is mounted to encapsulant 130A by window adhesive 126B as indicated by the dashed lines.

As shown in FIG. 7, window 124B has a greater surface area than the surface area of image sensor 114. Accordingly, window 124B extends laterally outwards past sides 114S of image sensor 114.

In accordance with this embodiment, mount 132A is mounted to upper surface 124U of window 124B by mount adhesive 648. More particularly, mounting surface 134A of mount 132A is mounted to upper surface 124U of window 124B by mount adhesive 648. Window 124B is between mount 132A and encapsulant 130A.

Figure 8:
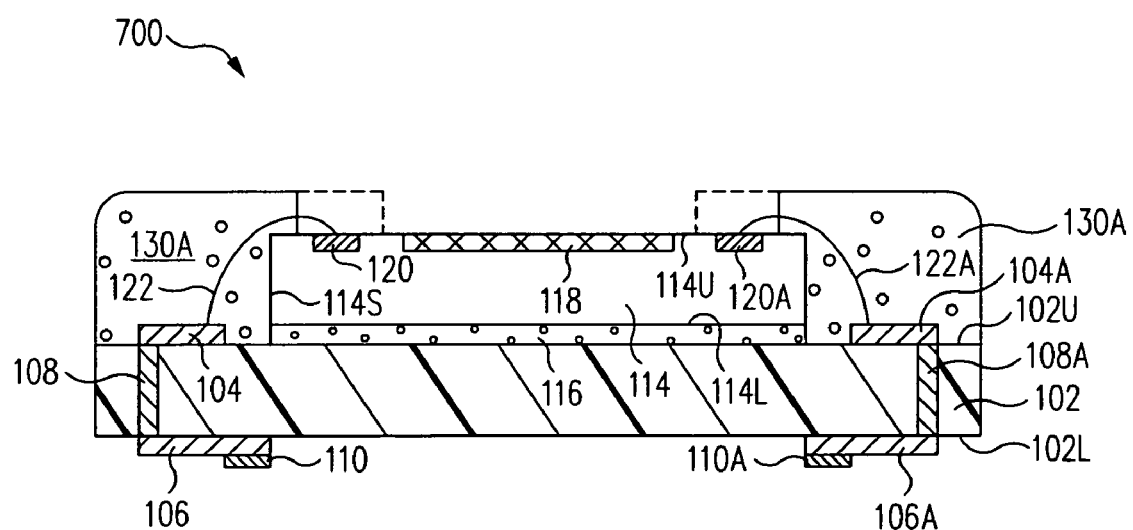
FIG. 8 is a cross-sectional view of the optical module of FIG. 7 during fabrication in accordance with one embodiment of the present invention.

FIG. 8 is a cross-sectional view of optical module 700 of FIG. 7 during fabrication in accordance with one embodiment of the present invention. Referring now to FIG. 8, lower surface 114L of image sensor 114 is attached to upper surface 102U of substrate 102 by adhesive 116. Bond pads 120 of image sensor 114 are electrically connected to upper traces 104 by bond wires 122. In one embodiment, bond wires 122 are formed by RSSB.

Encapsulant 130A is applied to the periphery of upper surface 114U and sides 114S of image sensor 114 and covers the exposed portions of upper surface 102U of substrate 102. In various embodiments, encapsulant 130A is applied by being dispensed, e.g., when encapsulant 130A is a liquid encapsulant, or by being molded, e.g., when encapsulant 130A is molding compound. As shown in FIG. 8, encapsulant 130A does not cover bond pads 120. However, as illustrated by the dashed lines, in one embodiment, encapsulant 130A covers bond pads 120 and entirely encloses bond wires 122.

Figure 9:
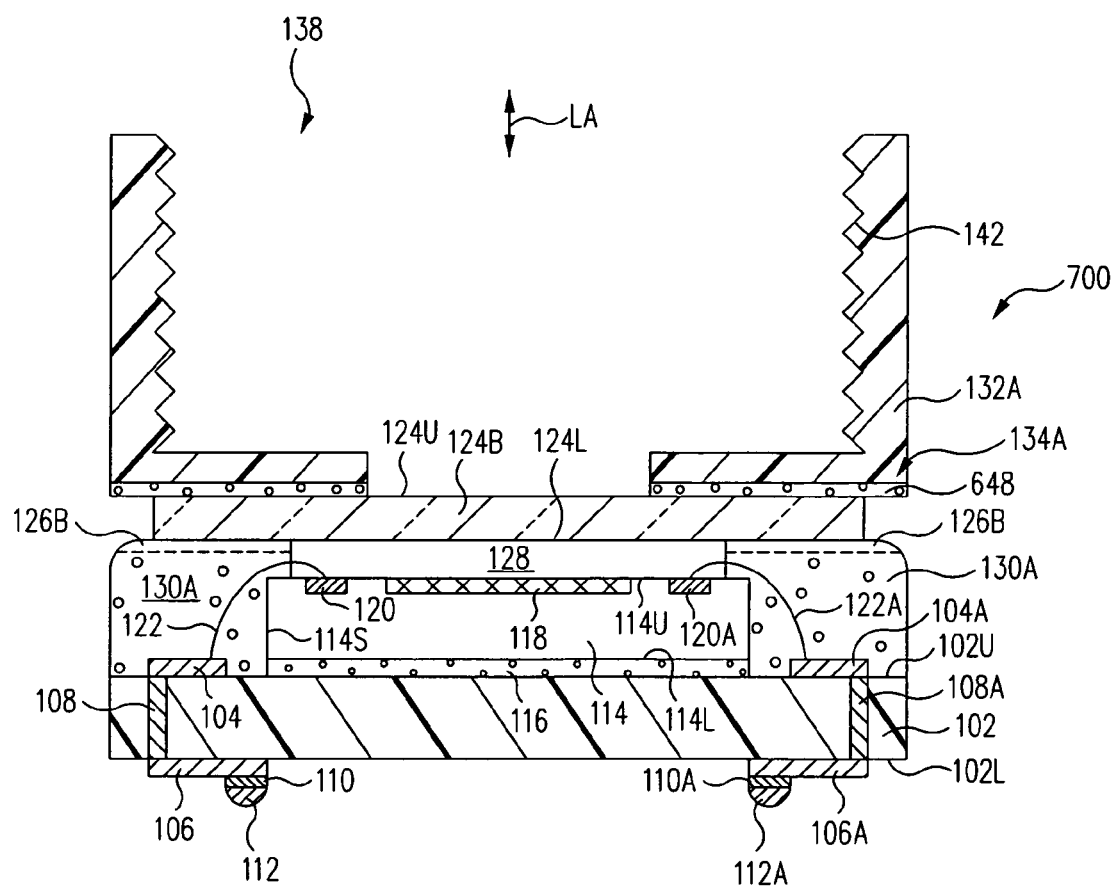
FIG. 9 is a cross-sectional view of the optical module of FIG. 8 at a later stage during fabrication in accordance with one embodiment of the present invention.

FIG. 9 is a cross-sectional view of optical module 700 of FIG. 8 at a later stage during fabrication in accordance with one embodiment of the present invention. Referring now to FIG. 9, interconnection balls 112 are formed. In other embodiments, interconnection balls 112 are formed at an earlier or later stage of fabrication of optical module 700.

Window 124B is moved toward image sensor 114 and into contact with encapsulant 130A. Encapsulant 130A is cured, e.g., optically or thermally cured, thus mounting window 124B above image sensor 114 as shown in FIG. 9. In accordance with this embodiment, encapsulant 130A directly adheres to lower surface 124L of window 124B.

In another embodiment, encapsulant 130A is mold. In accordance with this embodiment, window 124B is mounted to encapsulant 130A by window adhesive 126B as indicated by the dashed lines.

Mount 132A is mounted to upper surface 124U of window 124B by mount adhesive 648. In one embodiment, mount 132A is mounted to window 124B prior to mounting of window 124B to encapsulant 130A. In another embodiment, window 124B is mounted to encapsulant 130A, and then mount 132A is mounted to window 124B. Barrel 140 (FIG. 7) is mounted, e.g., threaded or screwed, to mount 132A thus completing fabrication of optical module 700.

Figure 10:
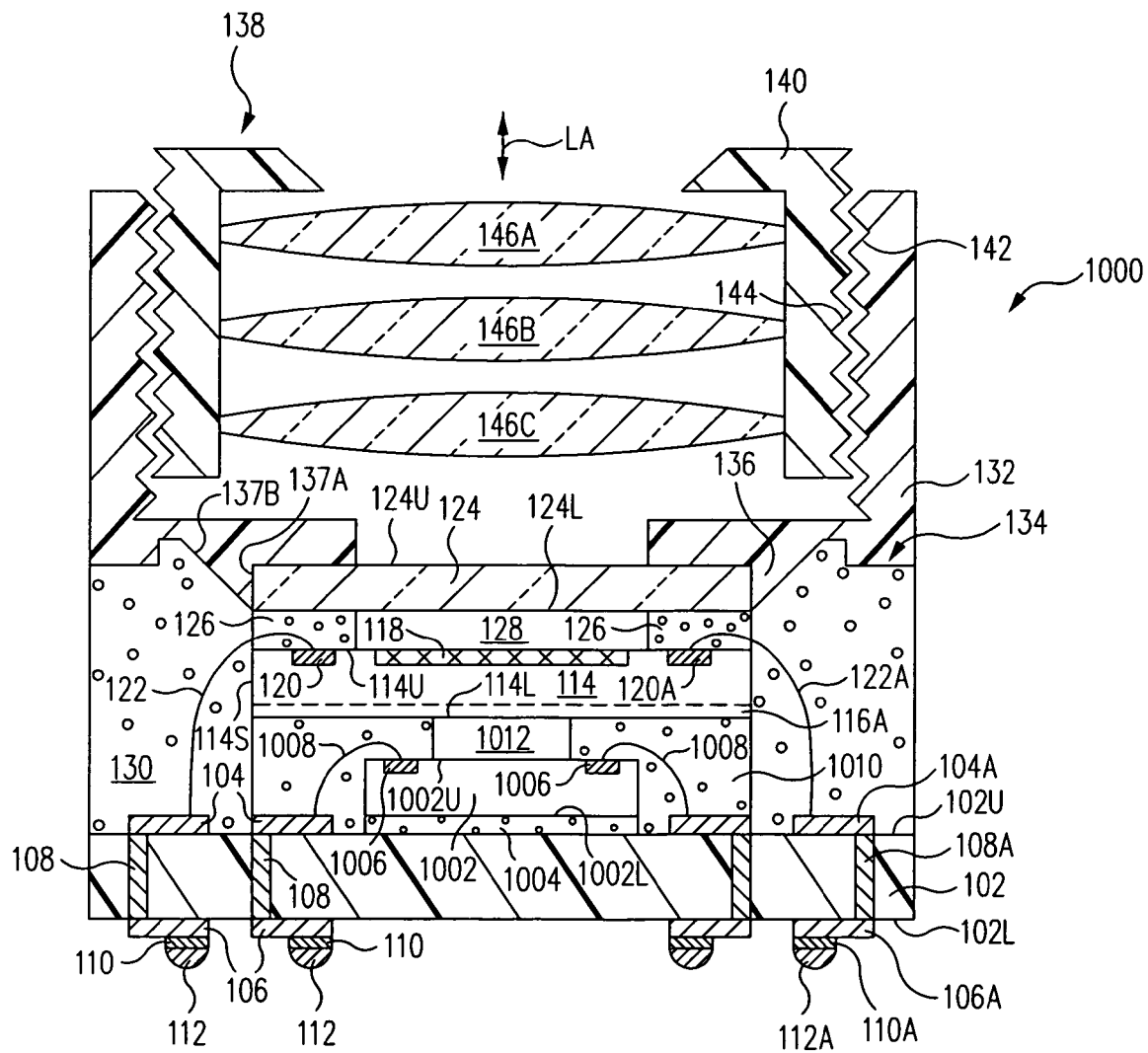
FIG. 10 is a cross-sectional view of an optical module in accordance with another embodiment of the present invention.

FIG. 10 is a cross-sectional view of an optical module 1000 in accordance with another embodiment of the present invention. Optical module 1000 of FIG. 10 is similar to optical module 100 of FIG. 1 and only the significant differences between optical module 1000 and optical module 100 are discussed below.

Referring now to FIG. 10, optical module 1000 includes an electronic component 1002, e.g., an integrated circuit or controller chip. More particularly, a lower, e.g., first, surface 1002L of electronic component 1002 is mounted to upper surface 102U of substrate 102 by an adhesive 1004. An upper, e.g., second, surface 1002U of electronic component 1002 includes bond pads 1006. Bond pads 1006 are electrically connected to upper traces 104 by bond wires 1008.

Image sensor 114 is mounted, sometimes called stacked, above electronic component 1002 by an image sensor spacer 1010. More particularly, lower surface 114L of image sensor 114 is mounted above electronic component 1002 with image sensor spacer 1010, e.g., a cured liquid encapsulant or mold.

In one embodiment, image sensor spacer 1010 is applied as a liquid encapsulant. Image sensor 114 is placed into image sensor spacer 1010, which is then cured. In accordance with this embodiment, image sensor spacer 1010 directly adheres to image sensor 114.

In another embodiment, image sensor spacer 1010 is mold formed using a mold. Image sensor 114 is then adhered to image sensor spacer 1010 using an adhesive 116A indicated by the dashed line.

As shown in FIG. 10, lower surface 114L of image sensor 114 has a greater total surface area than upper surface 1002U of electronic component 1002. Stated another way, image sensor 114 has a greater surface area, i.e., is larger, than electronic component 1002. However, in other embodiments, electronic component 1002 is the same size, or larger, than image sensor 114.

In accordance with this embodiment, image sensor spacer 1010 mounts the periphery of lower surface 114L of image sensor 114 to the periphery of upper surface 1002U of electronic component 1002. Image sensor spacer 1010 is applied directly on and covers bond pads 1006 and bond wires 1008.

Image sensor spacer 1010 does not cover a central region inward of bond pads 1008 of upper surface 1002U of electronic component 1002 in accordance with this embodiment. Accordingly, a cavity 1012 is formed by upper surface 1002U of electronic component 1002, lower surface 114L of image sensor 114, and image sensor spacer 1010. However, in another embodiment, image sensor spacer 1010 entirely covers electronic component 1002 such that cavity 1012 is not formed.

Bond wires 1008 are enclosed in image sensor spacer 1010. More particularly, image sensor spacer 1010 spaces image sensor 114 above the loop height of bond wires 1008, i.e., apart from bond wires 1008. Further, image sensor spacer 1010 covers at least the periphery of upper surface 1002U and sides 1002S of electronic component 1002 and a portion of upper surface 102U of substrate 102 adjacent electronic component 1002. Encapsulant 130 covers the exposed portion of upper surface 102U of substrate 102, sides 114S of image sensor 114, window adhesive 126, bond wires 122 and image sensor spacer 1010.

By stacking image sensor 114 above electronic component 1002, use of surface area of substrate 102 around image sensor 114 for electronic component 1002 is avoided. More generally, the size of substrate 102 is reduced compared to a substrate of an optical module in which an electronic component is mounted laterally adjacent to the image sensor. Accordingly, optical module 1000 has a small footprint allowing miniaturization of devices such as digital cameras or camera phones using optical module 1000.

Figure 11:
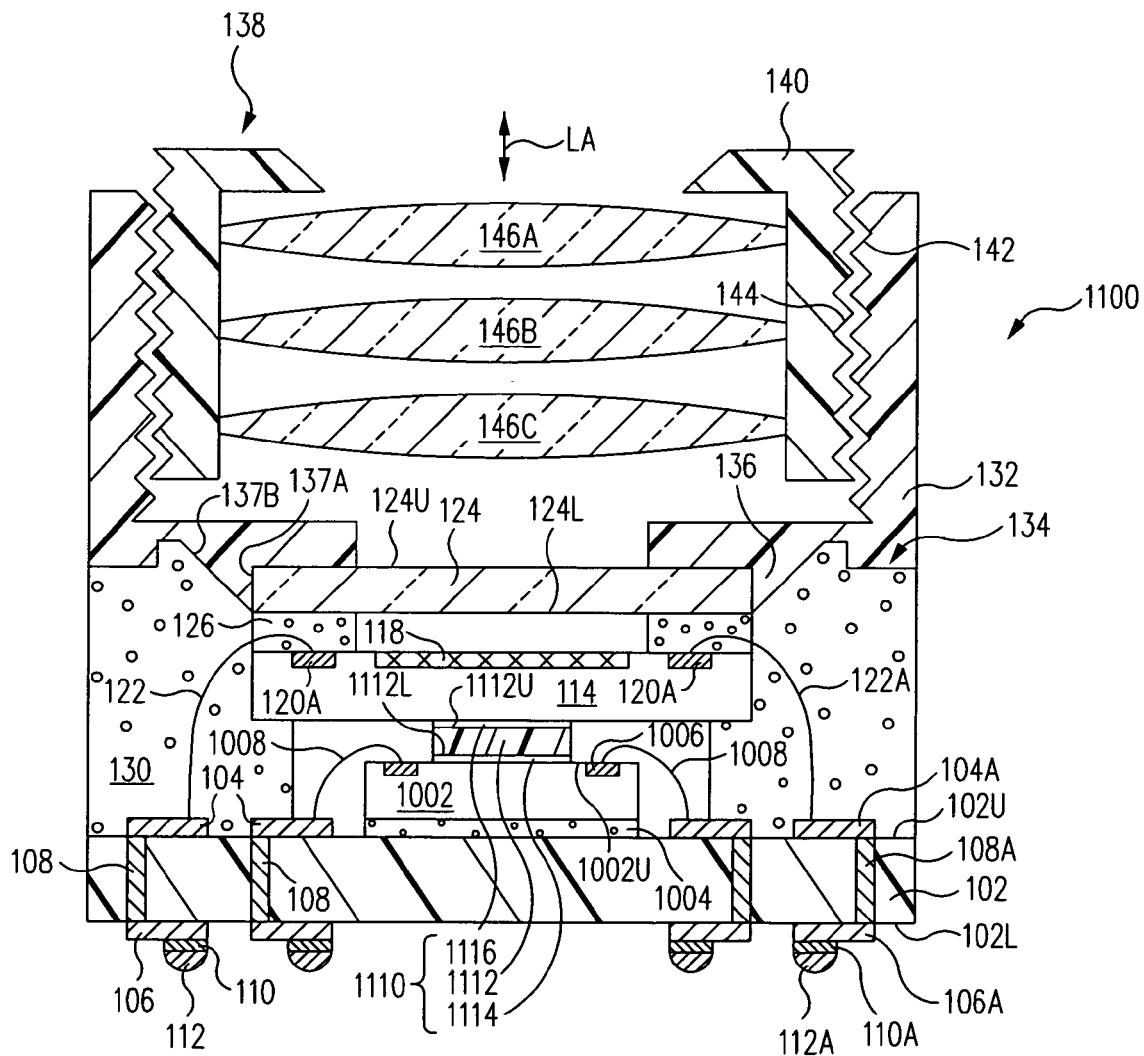
FIG. 11 is a cross-sectional view of an optical module in accordance with another embodiment of the present invention.

FIG. 11 is a cross-sectional view of an optical module 1100 in accordance with another embodiment of the present invention. Optical module 1100 of FIG. 11 is similar to optical module 1000 of FIG. 10 and only the significant differences between optical module 1100 and optical module 1000 are discussed below.

Referring now to FIG. 11, optical module 1100 includes an image sensor spacer 1110. Image sensor spacer 1110 mounts image sensor 114 above electronic component 1002. More particularly, image sensor spacer 1110 is mounted to a central region of upper surface 1002U of electronic component 1002 inward of bond pads 1006. Further, image sensor spacer 1110 is mounted to lower surface 114L of image sensor 114. Image sensor spacer 1110 spaces image sensor 114 above the loop height of bond wires 1008, i.e., apart from bond wires 1008.

In one embodiment, image sensor spacer 1110 includes a rigid spacer 1112, e.g., silicon, ceramic, laminate, and/or tape, with a lower, e.g., first, adhesive 1114 and an upper, e.g., second, adhesive 1116. More particularly, lower adhesive 1114 mounts upper surface 1002U of electronic component 1002 to a lower, e.g., first, surface 1112L of rigid spacer 1112, sometimes called a central spacer. Upper adhesive 1116 mounts lower surface 114L of image sensor 114 to an upper, e.g., second, surface 1112U of rigid spacer 1112. For example, image sensor spacer 1110 is a double sided sticky tape.

In another embodiment, image sensor spacer 1110, e.g., a cured liquid encapsulant, is itself the adhesive that mounts image sensor 114 above electronic component 1002. In accordance with this embodiment, image sensor spacer 1110 does not include upper and lower adhesive 1114, 1116.

As shown in FIG. 11, bond pads 1006 and bond wires 1008 are uncovered. However, in another embodiment, encapsulant 130 covers bond pads 1006, bond wires 1008, and encloses image sensor spacer 1110.

By stacking image sensor 114 above electronic component 1002, use of surface area of substrate 102 around image sensor 114 for electronic component 1002 is avoided. More generally, the size of substrate 102 is reduced compared to a substrate of an optical module in which an electronic component is mounted laterally adjacent to the image sensor. Accordingly, optical module 1100 has a small footprint allowing miniaturization of devices such as digital cameras or camera phones using optical module 1100.

The drawings and the forgoing description gave examples of the present invention. The scope of the present invention, however, is by no means limited by these specific examples. Numerous variations, whether explicitly given in the specification or not, such as differences in structure, dimension, and use of material, are possible. The scope of the invention is at least as broad as given by the following claims.

What is claimed is:

1. An optical module comprising:
    an image sensor comprising an active area;
    a window mounted directly to the image sensor above the active area;
    a window adhesive mounting a first surface of the window to a first surface of the image sensor, the first surface of the image sensor comprising the active area, wherein a shape of the first surface of the window is the same as a shape of the first surface of the image sensor;
    a mount coupled to the window; and
    a barrel supported by the mount.

2. The optical module of claim 1 wherein the window adhesive mounts the periphery of the first surface of the window to the periphery of the first surface of the image sensor.

3. The optical module of claim 1 wherein the first surface of the window, the first surface of the image sensor, and the window adhesive form a cavity, the active area being located within the cavity.

4. The optical module of claim 1 wherein the image sensor further comprises bond pads on the first surface of the image sensor, the window adhesive being applied directly on and covering the bond pads.

5. The optical module of claim 4 further comprising:
    a substrate comprising a first surface having traces thereon; and
    bond wires electrically connecting the bond pads to the traces.

6. The optical module of claim 5 wherein the window adhesive partially covers the bond wires.

7. The optical module of claim 5 wherein the window adhesive entirely covers the bond wires.

8. The optical module of claim 5 wherein the window adhesive spaces the window above a loop height of the bond wires.

9. The optical module of claim 1 wherein the image sensor further comprises bond pads on the first surface of the image sensor, the window adhesive being applied between the bond pads and the active area.

10. The optical module of claim 1 further comprising an encapsulant mounting the mount to the window, wherein the mount comprises a lip which protrudes into the encapsulant.

11. An optical module comprising:
    a substrate comprising a first surface;
    an electronic component coupled to the first surface of the substrate;
    an image sensor stacked above the electronic component by an image sensor spacer, the image sensor comprising an active area;
    a window mounted above the active area;
    a mount coupled to the window; and
    a barrel supported by the mount.

12. The optical module of claim 11 further comprising an adhesive coupling the image sensor to the image sensor spacer.

13. An optical module comprising:
    a substrate comprising a first surface;
    an electronic component coupled to the first surface of the substrate, the electronic component comprising bond pads on a first surface of the electronic component;
    an image sensor comprising an active area;
    an image sensor spacer stacking the image sensor above the electronic component, the image sensor spacer being coupled to a central region of the first surface of the electronic component inward of the bond pads, the image sensor spacer comprising:
        a central spacer;
        a first adhesive on a first surface of the central spacer; and
        a second adhesive on a second surface of the central spacer;
    a window mounted above the active area;
    a mount coupled to the window; and
    a barrel supported by the mount.

14. The optical module of claim 11 wherein a window adhesive mounts the window to the image sensor.

15. The optical module of claim 14 wherein the window, the image sensor, and the window adhesive form a cavity, the active area being located within the cavity.

16. The optical module of claim 14 wherein the image sensor further comprises bond pads on a first surface of the image sensor, the window adhesive being applied directly on and covering the bond pads.

17. The optical module of claim 11 further comprising an encapsulant mounting the mount to the window, wherein the mount comprises a lip which protrudes into the encapsulant.

18. The optical module of claim 13 wherein a window adhesive mounts the window to the image sensor.

19. The optical module of claim 18 wherein the window, the image sensor, and the window adhesive form a cavity, the active area being located within the cavity.

20. The optical module of claim 18 wherein the image sensor further comprises bond pads on a first surface of the image sensor, the window adhesive being applied directly on and covering the bond pads.

* * * * *